(12) United States Patent
Yang

(10) Patent No.: US 6,372,992 B1
(45) Date of Patent: Apr. 16, 2002

(54) CIRCUIT PROTECTIVE COMPOSITES

(75) Inventor: Rui Yang, Austin, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 09/680,159

(22) Filed: Oct. 5, 2000

(51) Int. Cl.$^7$ ................................................ H01B 7/08
(52) U.S. Cl. .................................................... 174/117 F
(58) Field of Search ............................ 174/117 F, 250, 174/255, 256, 117 FF; 29/830, 852; 156/245, 309.6; 428/1.1

(56) References Cited

U.S. PATENT DOCUMENTS

| | | | |
|---|---|---|---|
| 4,737,398 A | 4/1988 | Ikenaga et al. | 428/216 |
| 4,876,120 A | * 10/1989 | Belke et al. | 428/1.1 |
| 4,975,312 A | 12/1990 | Lusignea et al. | 428/209 |
| 5,248,530 A | 9/1993 | Jester et al. | 428/209 |
| 5,371,324 A | * 12/1994 | Kanno et al. | 174/117 F |
| 5,719,354 A | * 2/1998 | Jester et al. | 174/255 |

FOREIGN PATENT DOCUMENTS

| | | | | |
|---|---|---|---|---|
| DE | 198 38 266 A1 | 2/2000 | | |
| EP | 0 507 332 A2 | 10/1992 | | B32B/15/08 |
| EP | 0 508 368 A2 | 10/1992 | | B29C/55/18 |
| EP | 0 697 278 A1 | 2/1996 | | B32B/15/08 |
| EP | 0 764 515 A2 | 9/1996 | | B29C/49/00 |
| EP | 0 982 111 A2 | 3/2000 | | B29C/45/14 |
| EP | 1 044 800 A1 | 10/2000 | | B32B/15/08 |
| WO | WO 96/08945 | 9/1995 | | H05K/3/46 |

OTHER PUBLICATIONS

PCT Search Report for 56026WO.003—PCT/US01/02914.
Abstract for JP 2000068263 A.

* cited by examiner

*Primary Examiner*—Chau N. Nguyen
(74) *Attorney, Agent, or Firm*—Alan Ball; Gary L. Griswold; Gerald F. Chernivec

(57) ABSTRACT

A composite, useful as a flexible circuit, includes at least a portion of an electrical conductor having a first surface opposite a second surface. A first homogeneous polymeric film contacts the first surface of at least a portion of the electrical conductor. A second homogeneous polymeric film contacts at least a portion of the first film and the second surface of the at least a portion of the electrical conductor. The first and second films infuse to form a continuous phase surrounding the at least a portion of an electrical conductor. A process for producing a flexible circuit including hermetic sealing by providing at least one electrically conductive trace having a first surface opposite a second surface. At least a portion of the first surface is attached to a first homogeneous polymeric film. A second homogeneous polymeric film is contacted with at least a portion of the first film and at least a portion of the second surface. Thereafter, application of pressure to the first and second films, for a time at a selected temperature, promotes polymer infusion to form a continuous phase surrounding at least a portion of an electrically conductive trace.

40 Claims, 2 Drawing Sheets

CIRCUIT PROTECTIVE COMPOSITES

FIELD OF THE INVENTION

The present invention relates generally to liquid crystal polymer (LCP) film laminates, and more specifically to flex circuits comprising LCP substrate films laminated to a cover-layer of LCP film to encapsulate conductive circuit traces and protect them from environmental contamination.

BACKGROUND OF THE INVENTION

Thermal inkjet printers are fast, quiet devices that produce high quality printing by ejecting ink onto an image-recording medium. An image-recording medium, such as a sheet of paper, is struck only by ink as the printhead moves over the paper surface during image formation.

Thermal inkjet print cartridges operate by ejecting vaporized ink through one or more orifices to produce an ink dot on the recording medium. Ink ejection occurs quickly following rapid heating of a small volume of ink. Orifices may be arranged in arrays on a nozzle plate. As the printhead moves across the recording medium, a sequenced ejection of ink results in a printed portion of the desired image. Typically, after each pass of the printhead, the recording medium moves to allow the next printhead pass to deposit ink onto the adjacent area, until a complete image appears.

A typical inkjet print cartridge includes a printhead, an ink reservoir for containing liquid ink, which is delivered to the printhead, and a flex circuit for transmitting signals to the printhead. The printhead may be any of a variety of conventional structures, including those with nickel nozzle plates, and the like, or may be formed using Tape Automated Bonding (TAB).

Damage to a printhead cartridge may occur in several ways. A common problem involves attack by the ink jet ink composition on the surfaces of the ink jet printhead chamber and nozzles. Attack on the surfaces, by erosion, occurs before and during ink droplet ejection. The process of droplet ejection occurs at temperatures of about 300° C. Such a high temperature may accelerate wear occurring in the printhead. Protective coatings may extend printhead lifetime by retarding the rate of erosion.

It is known to use of organic polymers to protect flex circuitry from environmental agents such as dust and humidity. Although unsuitable for preventing printhead erosion, organic polymers are useful for protecting structures such as printed circuit interconnects in the proximity of an ink jet printhead from environmental agents such as dust and humidity and especially from ink jet ink spray. Ink spray, present during the operation of an inkjet printer, can deposit as ink droplets on interconnects comprised of electronic signal carrying conductive traces, usually made of copper. Droplets of ink contain ionic components. Spacing between individual circuit traces is such that an ionically conducting ink droplet could span the gap between adjacent traces causing an electrical short. In the presence of an electrical short, the inkjet printer may malfunction. Obviously an electrical short is much more likely to develop if circuit traces are exposed without a protective electrically insulating coating. Even with such a protective coating, the deposition of ink droplets in the region of conductive circuit traces may eventually cause electrical shorting between traces. This is possible because ink jet inks contain solvents as well as ionic components. Solvents in the ink will gradually dissolve certain insulative coatings to expose the underlying circuit traces. Solvent attack may be readily facilitated by surfactants also present in ink jet inks. Information on ink jet ink compositions is available by reference to e.g. JP 3097771, U.S. Pat. No. 4,853,037, 4,791,165, 4,786,327, EP 259001, U.S. Pat No. 4,694,302, 5,286,286, 5,169,438, 5,223,026, 5,429,860, 5,439,517, 5,421,871, 5,370,730, 5,165,968, 5,000,786 and 4,990,186.

Problems associated with deterioration of ink jet chambers and nozzles affect the useful service lifetime of an ink jet cartridge. The problem of electrical shorting between circuit traces, of interconnecting flex circuits, poses a more significant problem of premature failure of a printhead when the signal control circuit becomes compromised. Failure of this type primarily involves conductive traces formed on films of polyimide which is the most common substrate polymer used for flex circuits. Desirable properties of polyimide polymers for this application include high dielectric constant and thermal stability. Conductive traces on polyimide typically require a protective coating layer to prevent corrosion by a variety of contaminants including inkjet ink spray. For optimal protection, covercoat materials resist chemical attack, avoid contamination by outgassing and adhere well to conductive circuit traces and the polyimide circuit supporting substrate. A major drawback to firther progress using polyimide film relates to the way in which polyimide absorbs moisture to levels that interfere with high frequency device performance. Higher frequency operation requires the identification or development of electronic packaging materials with less susceptibility to moisture absorption.

Liquid crystal polymer (LCP) films find increasing use as substrates for flexible circuits having improved high frequency performance. Generally they have lower dielectric loss, and absorb less moisture than polyimide films. These beneficial properties of liquid crystal polymers were known previously but difficulties with processing prevented application of liquid crystal polymers to complex electronic assemblies.

The development of multi-axial, e.g. biaxial, film processing techniques expanded the use of liquid crystal polymer film for flexible circuit applications. U.S. Pat. No. 4,975,312 describes a printed wiring board substrate prepared from a multi-axially oriented thermotropic liquid crystalline polymer film having a tailored coefficient of thermal expansion in the X-Y direction and a thickness of not more than about 100 $\mu$. Materials of this type offer several potential advantages over the use of polyimide films for flex circuit substrates. Such potential advantages led to the use of readily available processing techniques for producing single layer or multilayer circuit structures supported by one or more layers of a liquid crystal film substrate. A multilayer flexible circuit is a combination of three or more layers of single or double-sided flexible circuits laminated together and processed with drill and plating to form plated through-holes. This creates conductive paths between the various layers without having to use multiple soldering operations.

U.S. Pat. No. 4,737,398 describes a laminated film comprising a metallic foil and a polymer layer laminated to the metallic foil. Metal foils in the range of 0.005–0.076 mm may be laminated to an anisotropic melt phase forming polymer to provide a polymer laminate 0.01–0.254 mm thick. The resulting laminates provide substrates for a variety of applications including electric and electronic wiring.

It is known that liquid crystal polymer films may be laminated together, or laminated to other materials. According to U.S. Pat. No. 5,248,530, to obtain good adhesion this process involves heating the LCP until it melts and flows to produce a bond between the laminated layers. Unfortunately, when an LCP is heated above its softening or melting point its molecular orientation and overall shape tend to change as the polymer flows. This problem may be overcome, as described in U.S. Pat. No. 5,248,530, by use of a material comprising a coextruded liquid crystal polymer (LCP) film or sheet wherein a higher melting LCP layer is enclosed in or sandwiched between layers or lower melting LCP. The LCP components are coextruded from the same die. This film or sheet may then be laminated on to other materials at a temperature between the melting points of the outer lower-melting LCP and the inner higher melting LCP. Under the conditions indicated above, the inner LCP maintains it shape, orientation and mechanical characteristics while the outer molten LCP component flows and bonds with the other material. Another laminate structure, described in European Patent EP 07646515, provides a composite material having at least three distinct regions formed by an outermost region of porous polytetrafluoroethylene(PTFE), an inner region of a liquid crystal polymer and an intermediate region produced by penetration of the LCP into the porous PTFE. Lamination of PTFE to LCP uses a heated platen press operating at temperatures in the range of 10° C. to 50° C. above the melting point of the thermotropic LCP. The composite structure forms with the LCP in a molten condition.

Liquid crystal polymer materials have received little attention as protective and encapsulating materials for electrical and electronic circuits and devices. German Patent DE 198 38 266, describes an apparatus and process for encapsulation of electrical circuits by means of an injection casting process. Japanese Patent JP 2000068263 uses an insulating LCP to cover the surface of an integrated circuit device such as a bare chip in a chip scale package. There is a clear demarcation boundary where the LCP layer contacts the surface of the chip. Since the packaging of most electronic devices falls either by delamination or circuit metal corrosion, any separation, along the boundary, between the chip surface and the LCP layer provides a point of access for fluids and other agents that may compromise the integrity of a circuit device.

In view of the deficiencies associated with known electronic packaging materials, the present invention has been developed to alleviate these drawbacks and provide further benefits to the user. These enhancements and benefits are described in greater detail hereinbelow with respect to several alternative embodiments of the present invention.

SUMMARY OF THE INVENTION

The present invention in its several disclosed embodiments provides a composite structure useful for packaging flex circuits for use with electronic devices. Preferably flex circuits, according to the present invention, comprise a LCP film substrate and a printed circuit laminated to a protective cover film of a liquid crystal polymer. Laminated structures disclosed herein provide improved performance compared to conventionally packaged electronic circuit devices including polyimide substrates. The present invention also facilitates electrical interconnection while preserving hermeticity to reduce the exposure of the conductive circuit traces to environmental contaminants that could compromise circuit integrity.

LCP film packages provide improved performance when compared with polyimide flex circuits. For example, the low moisture absorption, low gas transmission rate, excellent dimensional stability, and low coefficient of thermal expansion of LCP minimizes the potential for circuit contamination and dimensional stress during circuit assembly and operation. Low dielectric constant and low loss tangent characteristics allow LCP to operate effectively at frequencies, such as microwave frequencies, that extend beyond the useable range for polyimide flex circuits. Packaged flex circuits using LCP film laminates become substantially hermetically sealed due to adhesion and bond formation between polymer and metal during the timed application of heat and pressure. A packaging method according to the present invention produces a bonded composite that is highly resistant to attack such as by ingress of contaminants. Hermetic seal formation during the time of application of heat and pressure promotes infusion of LCP films, removing any evidence of a demarcation boundary between the films, even at temperatures at or below the melting point of the LCP. Infusion occurs in the absence of dimensional change of the circuit structure.

More particularly the present invention provides a composite comprising at least a portion of an electrical conductor having a first surface opposite a second surface. A first homogeneous polymeric film contacts the first surface of at least a portion of the electrical conductor. A second homogeneous polymeric film contacts at least a portion of the first film and the second surface of the at least a portion of the electrical conductor. The first and second films infuse to form a continuous phase surrounding the at least a portion of an electrical conductor.

Another embodiment according to the present invention provides a flexible circuit including hermetic sealing using a composite comprising at least a portion of an electrical conductor having a first surface opposite a second surface. A first homogeneous polymeric film is in contact with the first surface of the portion of the electrical conductor. A second homogeneous polymeric film contacts at least a portion of the first film and the second surface of the portion of the electrical conductor and the first and second films infuse to form a continuous phase surrounding the portion of the electrical conductor.

The present invention also includes a process for producing a flexible circuit including hermetic sealing comprising the steps of providing at least one electrically conductive trace having a first surface opposite a second surface. At least a portion of the first surface is attached to a first homogeneous polymeric film. A second homogeneous polymeric film is contacted with at least a portion of the first film and at least a portion of the second surface. Thereafter, application of pressure to the first and second films, for a time at a selected temperature, promotes polymer infusion to form a continuous phase surrounding at least a portion of an electrically conductive trace.

Definitions

The following definitions provide clarification of terms used herein for describing the present invention:

"Circuit Protective Composite" refers to the composite structure formed according to the present invention by laminating a homogeneous polymeric film as a coverlayer over the circuit traces of a printed circuit supported on a similar homogeneous polymeric film substrate. Lamination to form the composite occurs during timed application of heat and pressure to the films to produce a continuous phase around the circuit traces and an infusion layer having no clear demarcation boundary between the film layers.

The term "homogeneous polymeric film" refers to a film layer suitable for use to form a composite according to the present invention. The properties of the film are the same throughout the layer and the film has a single melting temperature. Homogeneous polymeric films may contains fillers and other additives as required for preferred embodiments of the present invention.

Use of the term "hermetically sealed" or "substantially hermetically sealed" indicates the existence of a material barrier to prevent access to protected structures, such as electrical conductors, by ingress of agents that may corrode or otherwise damage or compromise the function of a protected structure. An hermetically sealed package is not viewed as being completely impermeable due to the fact that the preferred liquid crystal polymer films used according to the present invention are subject to moisture penetration, albeit to a much lesser extent than commonly used polyimide films.

A "multilayer composite" according to the present invention refers to composite structures having additional printed circuits and/or coverlayers applied to a circuit protective composite according to the present invention.

The term "infusion" refers to polymer mobility between homogeneous polymeric films in a laminated condition during timed application of heat and pressure to produce a diffuse band of continuous polymeric phase that has no clearly defined demarcation boundary.

An "infusion layer" also referred to herein as "a continuous phase" is the diffuse band resulting from infusion of laminated polymers under the influence of pressure at elevated temperature.

The beneficial effects described above apply generally to the exemplary devices and mechanisms disclosed herein of the circuit protective composites. The specific structures through which these benefits are delivered will be described in detail hereinbelow.

BRIEF DESCRIPTION OF THE DRAWINGS

The invention will now be described in greater detail in the following way of example only and with reference to the attached drawings, in which.

DETAILED DESCRIPTION OF THE INVENTION

As required, detailed embodiments of the present invention are disclosed herein; however, it is to be understood that the disclosed embodiments are merely exemplary of the invention that may be embodied in various and alternative forms. The figures are not necessarily to scale, some features may be exaggerated or minimized to show details of particular components. Therefore, specific structural and functional details disclosed herein are not to be interpreted as limiting, but merely as a basis for the claims and as a representative basis for teaching one skilled in the art to variously employ the present invention.

Figure 1:
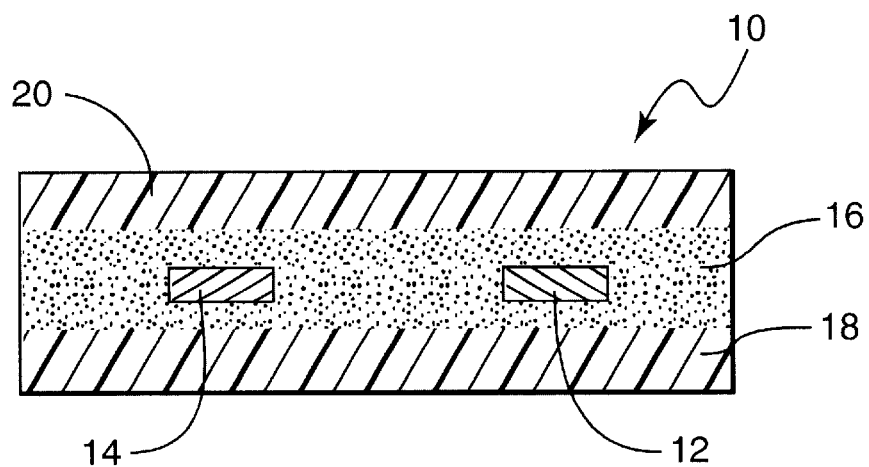
FIG. 1 is a cross sectional view of a composite according to the present invention.

Referring to the figures, wherein like numerals designate like parts throughout the several views, FIG. 1 provides a cross sectional view of a portion of a composite structure 10 according to the present invention. The composite structure 10 includes a first electrical conductor 12 and a second electrical conductor 14 surrounded by an infusion layer 16 produced during the timed application of heat and pressure to a first homogeneous polymeric film 18 and a second homogeneous polymeric film 20 on either side of the electrical conductors 12, 14.

Figure 2:
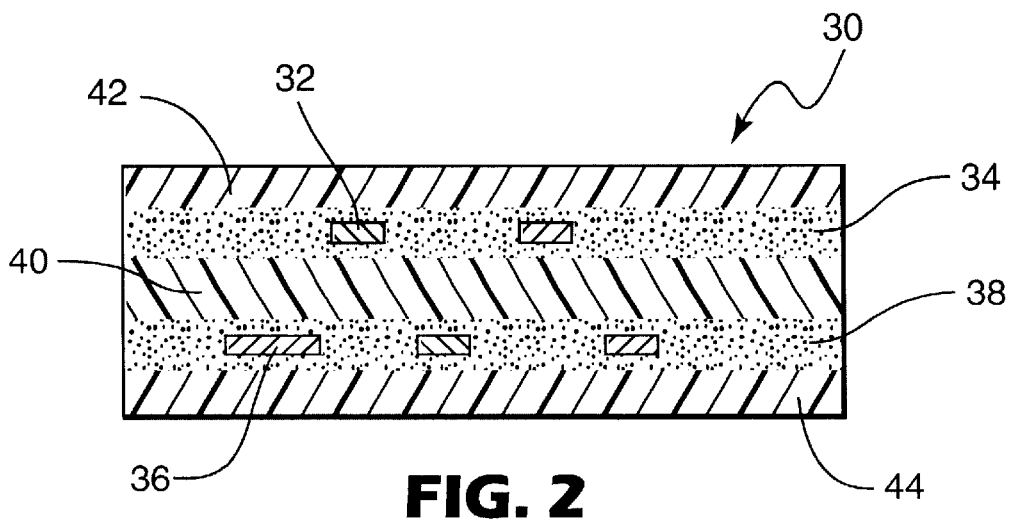
FIG. 2 is a cross section of a multilayer composite structure according to the present invention.

FIG. 2 shows a cross sectional view of a multilayer composite structure 30 according to the present invention. This view illustrates upper electrical conductors 32 surrounded by an upper infusion layer 34 and lower electrical conductors 36 surrounded by a lower infusion layer 38. Manufacture of the composite 30 requires the use of a homogeneous polymeric support film 40 having the upper electrical conductors 32 on one side and the lower electrical conductors 34 on the other. An upper homogeneous polymeric film 42 placed over the upper electrical conductors 32 and a lower homogeneous polymeric film 44 placed over the lower electrical conductors 34 produces the multilayer composite 30 illustrated in FIG. 2 after application of heat and pressure to the upper and lower homogeneous polymeric films 42, 44.

Figure 3:
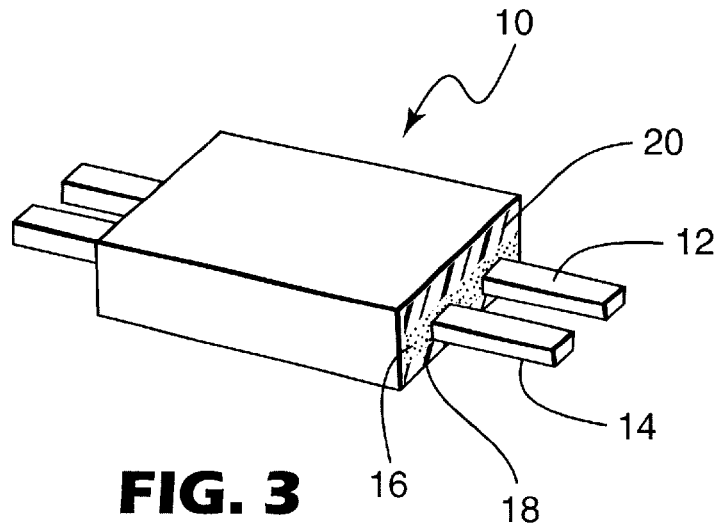
FIG. 3 provides a perspective view of composite according to the present invention showing electrical conductors extending therefrom.

FIG. 3 provides a perspective view, of the cross section of FIG. 1 showing a first electrical conductor 12 and a second electrical conductor 14 surrounded by an infusion layer 16 that was formed by timed application of heat and pressure to a first homogeneous polymeric film 18 and a second homogeneous polymeric film 20. There is no clearly defined demarcation boundary, or interface, between the films 18, 20 or gaps in the continuous phase 16 in the vicinity of the electrical conductors 12, 14. This condition provides electrical conductors 12, 14 substantially hermetically sealed within the infusion layer 16. Hermetic sealing relies upon the innate physical properties, such as moisture absorption rate, to prevent penetration of the continuous phase 16 by environmental contaminants such as fluids that may deposit on a composite 10 according to the present invention. A preferred composite according to the present invention comprises liquid crystal polymer films. Previous discussion indicates that, compared to polyimide polymers, the properties of liquid crystal polymers represent improved circuit protection when they are used in barrier, encapsulant or coverlay applications.

Figure 4:
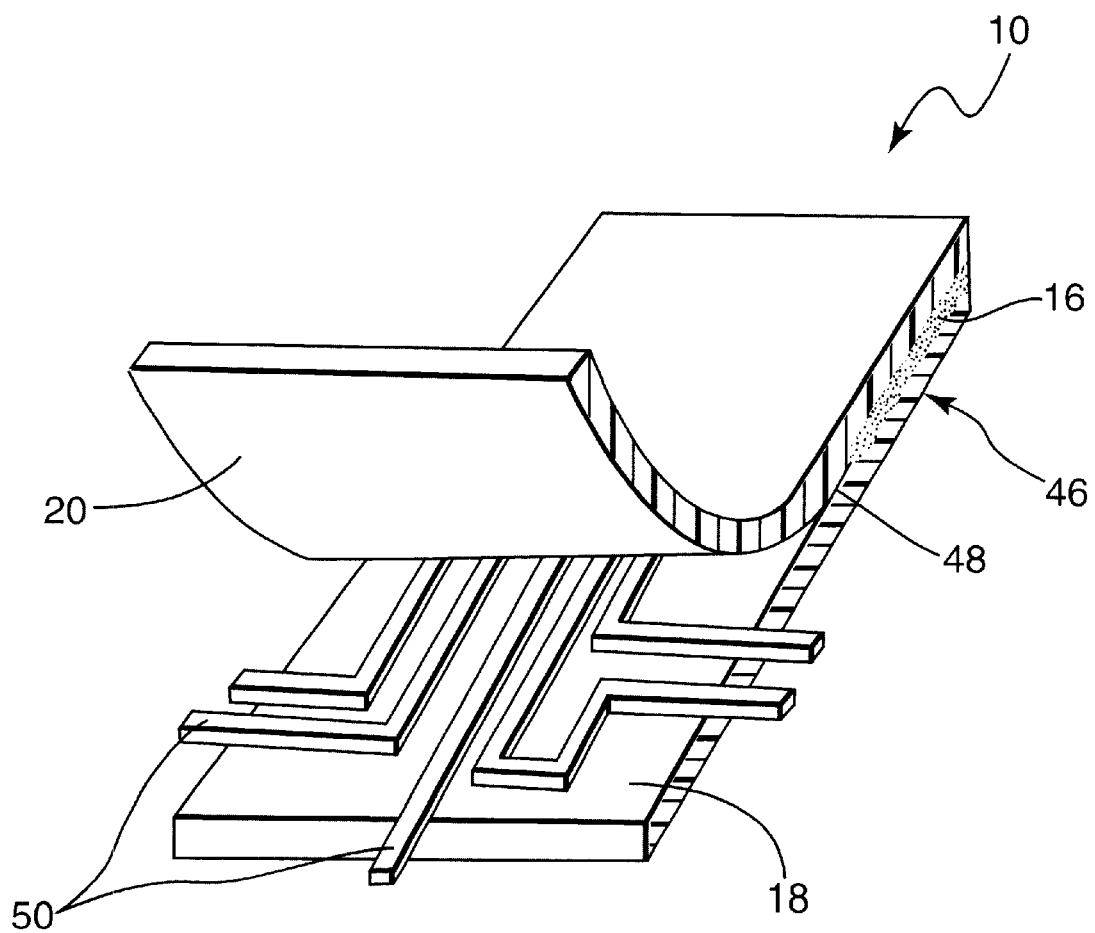
FIG. 4 is a perspective view showing the positioning of a coverlayer over printed circuit before formation of a composite according to the present invention.

FIG. 4 illustrates an embodiment of a composite according to the present invention during the lamination of a second homogeneous polymeric film 20 over a first homogeneous polymeric film 18 that has a plurality of conductive traces 50 at its upper surface. A composite portion 46, produced during timed heat and pressure lamination, indicates the formation of an infusion layer 16 between the films 18, 20. The infusion layer 16 is a diffuse layer formed when material from both films 18, 20 appears to migrate across the interface between them. Migration or blending of materials to form the infusion layer 16 removes the demarcation boundary 48 existing between the films 18, 20 before the application of heat and pressure to form the composite portion 46. Material migration leads to formation of a continuous phase, which is the infusion layer 16, around each of the plurality of conductive traces 50 representing a circuit particularly a flex circuit.

The formation of an infusion layer 16, as previously described, is a distinguishing feature of the present invention. With careful selection of conditions of pressure, time and temperature, formation of the continuous phase of the infusion layer 16 occurs at temperatures below the melting points of the homogenous polymeric films 18, 20. This discovery is contrary to previous teachings as in U.S. Pat. No. 5,248,530 wherein the co-extrusion of a lower melting LCP with a higher melting LCP provides a non-homogeneous film having opposing surfaces with differing melting properties. The non-homogeneous film was necessary to provide a combination of molten and solid LCP for adhesion and dimensional stability of the film. Surprisingly, using timed application of pressures and temperatures according to the present invention, a unified composite structure forms during heating of homogeneous polymeric films from temperatures below heir melting point to temperatures no more than 5° C. higher than the melting points of the films. Successful composite formation according to the present invention relies upon a balance of the conditions of time, temperature and pressure to laminate the homogeneous polymeric films with formation of an infusion layer surrounding electrical conductors that preferably represent circuit traces between the films. Heating a laminate structure at temperatures below the melting point of the homogeneous polymeric films may require either a longer time or a higher pressure to produce a continuous phase of an infusion layer around electrically conductive traces. At higher laminating temperatures, infusion layer formation may occur at lower pressure or shorter amounts of time.

A process for forming a composite according to the present invention may be accomplished in relatively few steps as indicated by reference to FIG. 4 as follows. Selection of a circuit pattern of conductive traces 50 on a homogeneous polymeric film support 18 provides a printed circuit material, preferably a flexible printed circuit material. A second homogeneous polymeric film 20 positioned over the circuit pattern provides a coverlayer for the printed circuit. Lamination of the films accompanied by encapsulation of the conductive traces 50 requires selection of a balanced set of conditions of time, temperature and pressure to unify the films 18, 20 into the composite 10 and develop the infusion layer 16. Selection of suitable conditions produces a composite 10 in which the conductive traces become substantially hermetically sealed against attack by environmental contaminants including ink spray generated by ink jet printers.

Experimental
Preparation of Circuit Protective Composites

Investigation of circuit protective composites according to the present invention for protecting and substantially hermetically sealing circuit traces, required first the preparation of flex circuits followed by application and lamination of a coverlayer film. Additive and subtractive processes are well known for the production of printed circuits. Either process may be used to provide flex circuits used in circuit protective composites. The conductive circuit traces were formed on the surface of a commercially available liquid crystal polymer. Suitable commercially available liquid crystal polymers are known to be available from Hoechst Celanese Corporation under the tradename VECTRA, from Amoco Company using the tradename XYDAR, as well as from W. L. Gore and Associates of Japan and Kuraray Corporation of Japan. The LCP films may include a layer of metal, depending on the selection of additive or subtractive process for production of a flex circuit. Preferably the flex circuit is made by a subtractive process using a laminate including 50 $\mu$m LCP film with a copper layer 12 $\mu$m thick. The surfaces of the copper traces were not treated after the copper subtractive etching process.

A coverlay LCP film was placed over the circuit traces of a flexible printed circuit. The simplest form of a circuit protective composite is a sandwich structure including conductive circuit traces between polymer films. Production of the final composite requires timed application of heat and pressure. This can be accomplished using continuous roll to roll processing or in a batch mode using individual coverlay sheets.

Lamination Conditions

Lamination condition depends on the LCP film used. Preferably the crystalline transition point of the LCP is in the range from about 290° C. to about 350° C. After raising the temperature to between about 290° C. and 320° C., a pressure of about 1380 kPa (200 psi) to about 2070 kPa (300 psi) was applied for a time in the range of about 45 seconds to about 90 seconds. Preferably the conditions for lamination include a temperature of about 300° C., a pressure of about 2070 kPa (300 psi) and a time of about 60 seconds. The resulting circuit protective composites appeared to be flat, showing no curl or similar form of film distortion. Also there was no noticeable change in the shape or dimensions of the LCP film.

After completion of the process of composite formation, a LCP cover film shows strong bonding to copper circuit traces and the LCP film supporting them. Viewed in cross section, a circuit protective composite according to the present invention was free of voids and no clear demarcation boundary was visible between the two LCP films. Any attempt to separate an outer LCP film from the remainder of the composite resulted in random rupture of the LCP. This means that no failure occurred at the original interface between the printed circuit and the coverlay film.

Composite Processing

The LCP film can be pre-punched with designed patterns or can be laminated without any pattern. In the latter case chemical etching or laser ablation of either LCP film will yield a patterned LCP film having openings to electrical contact pads after the lamination to form a circuit protective composite according to the present invention. A variety of lagers may be used to ablate LCP layers of circuit protective composites. The ablation process preferably uses a PacTech laser machine operating at 70 amps current to produce a 13 microsecond pulse of radiation having a wavelength of 1064 nm. At this condition the LCP melts to provide a small hole exposing the surface of a copper trace. Connection may be made to the exposed copper trace by inserting an 8 mm solder ball into the hole and melting the solder ball with a laser pulse at 50 amps current. The resulting connection showed an electrical resistance of 0.4 ohms.

Ink Bomb Testing

Composites according to the present invention were compared with polyimide flex circuits to which a coverlayer of LCP had been laminated. Samples of structures of the invention and those using polyimide circuits were placed in a pressure vessel containing ink jet ink designated as HP 135 having a pH of 8.5. After closing the pressure vessel its temperature was raised to 200° C. and held there for a period of 60 minutes. After cooling the vessel, samples were removed and attempts made to peel the coverlayer from the circuit. In all cases the LCP coverlayer was removed along a clearly defined demarcation boundary between the LCP and polyimide films. In contrast, circuit protective composites according to the present invention, having no clear demarcation boundary, strongly resisted separation into layers.

Circuit protective composites according to the present invention have potential application as electronic packages to provide abrasion resistance and electrically insulating protective layers for product applications in areas such as integrated circuit packaging (ICP), ink jet printers, hard disk drives, medical and biomedical equipment and automotive applications and liquid crystal display.

A composite, useful as a flexible circuit, and its components have been described herein, These and other variations, which will be appreciated by those skilled in the art, are within the intended scope of this invention as claimed below. As previously stated, detailed embodiments of the present invention are disclosed herein; however, it is to be understood that the disclosed embodiments are merely exemplary of the invention that maybe embodied in various forms.

What is claimed is:

1. A composite comprising:
    at least a portion of an electrical conductor having a first surface opposite a second surface;
    a first homogeneous polymeric film in contact with said first surface of said at least a portion of said electrical conductor; and
    a second homogeneous polymeric film contacting at least a portion of said first film and said second surface of said at least a portion of said electrical conductor, said first and second films infusing to form a continuous phase surrounding said at least a portion of said electrical conductor, said composite having an appearance free from film distortion.

2. A composite according to claim 1, wherein each of said first and second homogeneous polymeric films is a liquid crystal polymer film.

3. A composite according to claim 1 wherein said first and second films infuse during application of a pressure at an elevated temperature for an amount of time.

4. A composite according to claim 3 wherein said pressure is from about 1380 kPa to about 2070 kPa.

5. A composite according to claim 3, wherein said temperature is no more than 5° C. above the melting point of each of said first and second homogeneous polymeric films.

6. A composite according to claim 3 wherein said amount of time is from about 45 seconds to about 90 seconds.

7. A flexible circuit including hermetic sealing using a composite comprising:
    at least a portion of an electrical conductor having a first surface opposite a second surface;
    a first homogeneous polymeric film in contact with said first surface of said at least a portion of said electrical conductor; and
    a second homogeneous polymeric film contacting at least a portion of said first film and said second surface of said at least a portion of said electrical conductor, said first and second films infusing to form a continuous phase surrounding said at least a portion of said electrical conductor, said composite having an appearance free from film distortion.

8. A flexible circuit according to claim 7, wherein each of said first and second homogeneous polymeric films is a liquid crystal polymer film.

9. A flexible circuit according to claim 7 wherein said first and second films infuse during application of a pressure at an elevated temperature for an amount of time.

10. A flexible circuit according to claim 9 wherein said pressure is from about 1380 kPa to about 2070 kPa.

11. A flexible circuit according to claim 9, wherein said temperature is no more than 5° C. above the melting point of each of said first and second homogeneous polymeric films.

12. A flexible circuit according to claim 9 wherein said amount of time is from about 45 seconds to about 90 seconds.

13. A process for producing a flexible circuit including hermetic sealing comprising the steps of:
    providing at least one electrically conductive trace having a first surface opposite a second surface, at least a portion of said first surface being attached to a first homogeneous polymeric film;
    placing a second homogeneous polymeric film in contact with at least a portion of said first film and at least a portion of said second surface; and
    applying pressure to said first and second films for a time and temperature to promote polymer infusion to form a continuous phase surrounding at least a portion of said electrically conducting trace, to provide said flexible circuit having an appearance free from film distortion.

14. A process according to claim 13 wherein each of said first and second homogeneous polymeric films is a liquid crystal polymer film.

15. A process according to claim 13 wherein said pressure is from about 1380 kPa to about 2070 kPa.

16. A process according to claim 13 wherein said temperature is no more than 5° C. above the melting point of each of said first and second homogeneous polymeric films.

17. A flexible circuit according to claim 13 wherein said time is from about 45 seconds to about 90 seconds.

18. A composite comprising:
    at least a portion of an electrical conductor having a first surface opposite a second surface;
    a first homogeneous polymeric film in contact with said first surface of said at least a portion of said electrical conductor; and
    a second homogeneous polymeric film contacting at least a portion of said first film and said second surface of said at least a portion of said electrical conductor, said first and second films infusing during application of a pressure at an elevated temperature for an amount of time from about 45 seconds to about 90 seconds to form a continuous phase surrounding said at least a portion of said electrical conductor.

19. A flexible circuit including hermetic sealing using a composite comprising:
    at least a portion of an electrical conductor having a first surface opposite a second surface;
    a first homogeneous polymeric film in contact with said first surface of said at least a portion of said electrical conductor; and
    a second homogeneous polymeric film contacting at least a portion of said first film and said second surface of said at least a portion of said electrical conductor, said first and second films infusing during application of a pressure at an elevated temperature for an amount of time from about 45 seconds to about 90 seconds to form a continuous phase surrounding said at least a portion of said electrical conductor.

20. A process for producing flexible circuit including hermetic sealing comprising the steps of:
    providing at least one electrically conductive trace having a first surface opposite a second surface, at least a portion of said first surface being attached to a first homogeneous polymeric film;
    placing a second homogeneous polymeric film in contact with at least a portion of said first film and at least a portion of said second surface; and
    applying pressure to said first and second films for a time from about 45 seconds to about 90 seconds at a temperature to promote polymer infusion to form a continuous phase surrounding at least a portion of said electrically conductive trace.

21. A composite comprising:
at least a potion of an electrical conductor having a first surface opposite a second surface;
a first homogeneous polymeric film in contact with said first surface of said at least a portion of said electrical conductor;
a second homogeneous polymeric film contacting at least a portion of said first film and said second surface of said at least a portion of said electrical conductor; and
an infusion layer forming a continuous phase between said first homogeneous polymeric film and said second homogeneous polymeric film at said at least a portion of said first film, said infusion layer surrounding said at least a portion of said electrical conductor.

22. The composite of claim 21, having an appearance free from film distortion.

23. The composite of claim 21, wherein each of said first homogeneous polymeric film and said second homogeneous polymeric film is a liquid crystal polymer.

24. The composite of claim 21, wherein said infusion layer forms by application of a pressure, for an amount of time, at an elevated temperature to each of said first homogeneous polymeric film and said second homogeneous polymeric film.

25. The composite of claim 24, wherein said pressure is from about 1380 kPa to about 2070 kPa.

26. The composite of claim 24, wherein said elevated temperature is no more than 5° C. above the melting point of each of said first homogeneous polymeric film and said second homogenous polymeric film.

27. The composite of claim 24, wherein said amount of time is from about 45 seconds to about 90 seconds.

28. A flexible circuit including hermetic sealing using a composite comprising:
at least a portion of at least one electrically conductive trace, said at least a portion having a first surface opposite a second surface;
a first homogeneous polymeric film in contact with said first surface of said at least a portion of said at least one electrically conductive trace;
a second homogeneous polymeric film containing at least a portion of said first film and said second surface of said at least a portion of said at least one electrically conductive trace; and
an infusion layer forming a continuous phase between said first homogeneous polymeric film and said second homogeneous polymeric film at said at least a portion of said first film, said infusion layer surrounding said at least a portion of said at least one electrically conductive trace.

29. The flexible circuit of claim 28, having an appearance free from film distortion.

30. The flexible circuit of claim 28, wherein each of said first homogeneous polymeric film and said second homogeneous polymeric film is a liquid crystal polymer.

31. The flexible circuit of claim 28, wherein said infusion layer forms by application of a pressure, for an amount of time, at an elevated temperature to each of said first homogeneous polymeric film and said second homogenous polymeric film.

32. The flexible circuit of claim 31, wherein said pressure is from about 1380 kPa to about 2070 kPa.

33. The flexible circuit of claim 31, wherein said elevated temperature is no more than 5° C. above the melting point of each of said first homogeneous polymeric film and said second homogeneous polymeric film.

34. The flexible circuit of claim 31, wherein said amount of time is from about 45 seconds to about 90 seconds.

35. A process for producing a flexible circuit including hermetic sealing comprising the steps of:
providing at least one electrically conductive trace having a first surface opposite a second surface, at least a portion of said first surface being attached to a first homogeneous polymeric film;
placing a second homogeneous polymeric film in contact with at least a portion of said first film and at least a portion of said second surface of said at least one electrically conductive trace; and
applying pressure to said first and second homogeneous films for an amount of time at a temperature to promote formation of an infusion layer as a continuous phase between said first homogeneous polymeric film and said second homogeneous polymeric film at said at least a portion of said first film, said infusion layer surrounding said at least a portion of said at least one electrically conductive trace.

36. The process of claim 35, providing said flexible circuit having an appearance free from film distortion.

37. The process of claim 35, wherein each of said first homogeneous polymeric film and said second homogeneous polymeric film is a liquid crystal polymer.

38. The process of claim 35, wherein said pressure is from about 1380 kPa to about 2070 kPa.

39. The process of claim 35, wherein said elevated temperature is no more than 5° C. above the melting point of each of said first homogeneous polymeric film and said second homogeneous polymer film.

40. The process of claim 35, wherein said amount of time is from about 45 seconds to about 90 seconds.

* * * * *